United States Patent
Liu et al.

(10) Patent No.: US 12,281,387 B2
(45) Date of Patent: Apr. 22, 2025

(54) METHOD OF DEPOSITING METAL FILMS

(71) Applicant: Applied Materials, Inc., Santa Clara, CA (US)

(72) Inventors: Feng Q. Liu, San Jose, CA (US); Mark Saly, Santa Clara, CA (US); David Thompson, San Jose, CA (US); Annamalai Lakshmanan, Fremont, CA (US); Avgerinos V. Gelatos, Scotts Valley, CA (US); Joung Joo Lee, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 17/566,026

(22) Filed: Dec. 30, 2021

(65) Prior Publication Data

US 2023/0227975 A1    Jul. 20, 2023

(51) Int. Cl.
*C23C 16/455* (2006.01)
*C07F 17/00* (2006.01)
(Continued)

(52) U.S. Cl.
CPC ........ *C23C 16/45553* (2013.01); *C07F 17/00* (2013.01); *C07F 17/02* (2013.01); *C23C 16/18* (2013.01); *C23C 16/45536* (2013.01)

(58) Field of Classification Search
CPC ............. C23C 16/18; C23C 16/45553; C23C 16/45536
See application file for complete search history.

(56) References Cited

U.S. PATENT DOCUMENTS

2006/0115595 A1    6/2006  Shenai-Khatkhate et al.
2011/0198756 A1*   8/2011  Thenappan ............. C07F 17/02
                                                    257/E21.294
(Continued)

FOREIGN PATENT DOCUMENTS

JP        2018035375 A     3/2015
KR     20200056543 A     5/2020
(Continued)

OTHER PUBLICATIONS

U.S. Appl. No. 17/146,666, filed Jan. 12, 2021, 47 pages.
U.S. Appl. No. 17/146,680, filed Jan. 12, 2021, 42 pages.
U.S. Appl. No. 17/146,683, filed Jan. 12, 2021, 42 pages.
(Continued)

*Primary Examiner* — Nathan T Leong
(74) *Attorney, Agent, or Firm* — Servilla Whitney LLC

(57) ABSTRACT

Organometallic precursors and methods of depositing high purity metal films are discussed. Some embodiments utilize a method comprising exposing a substrate surface to an organometallic precursor comprising one or more of molybdenum (Mo), tungsten (W), osmium (Os), technetium (Tc), manganese (Mn), rhenium (Re) or ruthenium (Ru), and an iodine-containing reactant comprising a species having a formula $RI_x$, where R is one or more of a $C_1$-$C_{10}$ alkyl, $C_3$-$C_{10}$ cycloalkyl, $C_2$-$C_{10}$ alkenyl, or $C_2$-$C_{10}$ alkynyl group, I is an iodine group and x is in a range of 1 to 4 to form a carbon-less iodine-containing metal film. Some embodiments advantageously provide methods of forming metal films having low carbon content (e.g., having greater than or equal to 95% metal species on an atomic basis), without using an oxidizing agent or a reductant.

5 Claims, 3 Drawing Sheets

(51) Int. Cl.
    *C07F 17/02*       (2006.01)
    *C23C 16/18*       (2006.01)

(56) References Cited

U.S. PATENT DOCUMENTS

| | | | |
|---|---|---|---|
| 2015/0348902 A1* | 12/2015 | Naik | H01L 21/76807 |
| | | | 257/774 |
| 2018/0195167 A1 | 7/2018 | Liu et al. | |
| 2019/0390340 A1* | 12/2019 | Yu | C23C 16/45544 |
| 2020/0339617 A1* | 10/2020 | Kim | C07F 15/0046 |
| 2021/0151352 A1 | 5/2021 | Zope et al. | |
| 2021/0214842 A1 | 7/2021 | Yoon et al. | |
| 2021/0285102 A1 | 9/2021 | Yoon et al. | |

FOREIGN PATENT DOCUMENTS

| | | | |
|---|---|---|---|
| TW | 201037768 | * | 10/2010 |
| WO | 2020076502 A1 | | 4/2020 |
| WO | WO2020101336 | * | 5/2020 |

OTHER PUBLICATIONS

U.S. Appl. No. 17/146,878, filed Jan. 12, 2021, 45 pages.
U.S. Appl. No. 17/146,890, filed Jan. 12, 2021, 44 pages.
U.S. Appl. No. 17/189,963, filed Mar. 2, 2021, 63 pages.
U.S. Appl. No. 17/236,020, filed Apr. 21, 2021, 44 pages.
U.S. Appl. No. 17/365,919, filed Jul. 1, 2021, 40 pages.
U.S. Appl. No. 63/195,353, filed Jun. 1, 2021, 40 pages.
PCT International Search Report and Written Opinion in PCT/US2022/053932 mailed Apr. 20, 2023, 12 pages.

* cited by examiner

METHOD OF DEPOSITING METAL FILMS

TECHNICAL FIELD

Embodiments of the disclosure generally relate to methods for depositing metal films. More particularly, embodiments of the disclosure are directed to methods for depositing high purity metal films having low carbon content and low resistivity.

BACKGROUND

The semiconductor processing industry continues to strive for larger production yields while increasing the uniformity of layers deposited on substrates having larger surface areas. These same factors in combination with new materials also provide higher integration of circuits per unit area of the substrate. As circuit integration increases, the need for greater uniformity and process control regarding layer thickness rises. As a result, various technologies have been developed to deposit layers on substrates in a cost-effective manner, while maintaining control over the characteristics of the layer.

Chemical vapor deposition (CVD) is one of the most common deposition processes employed for depositing layers on a substrate. CVD is a flux-dependent deposition technique that requires precise control of the substrate temperature and the precursors introduced into the processing chamber in order to produce a desired layer of uniform thickness. These requirements become more critical as substrate size increases, creating a need for more complexity in chamber design and gas flow technique to maintain adequate uniformity.

A variant of CVD that demonstrates excellent step coverage is cyclical deposition or atomic layer deposition (ALD). Cyclical deposition is based upon atomic layer epitaxy (ALE) and employs chemisorption techniques to deliver precursor molecules on a substrate surface in sequential cycles. The cycle exposes the substrate surface to a reactant/precursor, a purge gas, a reactant/precursor and the purge gas. The precursor and the reactant react to form a product compound as a film on the substrate surface. The cycle is repeated to form the layer to a desired thickness. Some cycles expose the substrate surface to a reactant/precursor, a purge gas, a reactant/precursor, and the purge gas, and expose the film having the product compound to a reductant to form a deposited film (e.g., a metal film).

The advancing complexity of advanced microelectronic devices is placing stringent demands on currently used deposition techniques. Unfortunately, there is a limited number of viable chemical precursors available that have the requisite properties of robust thermal stability, high reactivity, and vapor pressure suitable for film growth to occur. In addition, precursors that often meet these requirements, e.g., organometallic precursors, lead to deposition reactions that produce metal-carbon bonds that are difficult to reduce. Current processes include oxidizing metal-carbon bonds to form metal-oxygen bonds to deposit a metal film. Metal-oxygen bonds are also difficult to reduce to deposit a metal film. Halogen-containing reactants, for example, convert the metal-carbon bonds to metal-halogen bonds. It is believed that halogen-containing reactants can react with organometallic precursors on the substrate surface to deposit metal films.

There is, therefore, a need in the art for viable organometallic precursors, viable halogen-containing reactants, and methods for depositing high purity metal films having low carbon content and low resistivity.

SUMMARY

One or more embodiments of the disclosure are directed to a method of depositing a film comprising exposing a substrate surface to an organometallic precursor and an iodine-containing reactant to form a carbon-less iodine-containing metal film, the organometallic precursor having a structure of general formulae (I), (II), (III) or (IV)

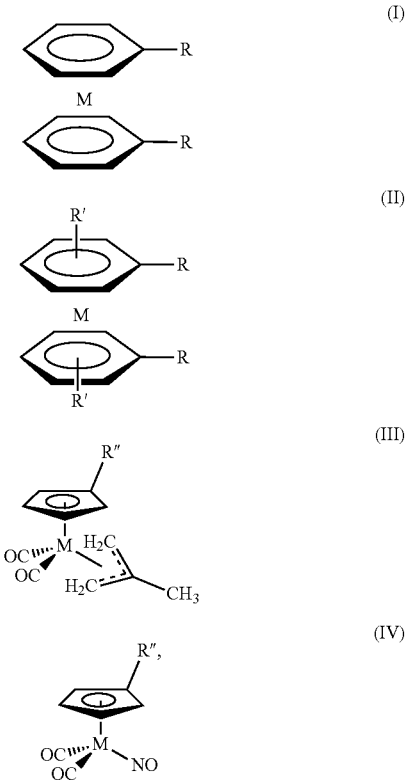

wherein M is independently selected from molybdenum (Mo), tungsten (W), osmium (Os), technetium (Tc), manganese (Mn), rhenium (Re) or ruthenium (Ru), R is independently selected from hydrogen, methyl, ethyl, isopropyl, propyl, or butyl, R' is independently selected from methyl, ethyl, isopropyl, propyl, or butyl, and R" is independently selected from a $C_3$-$C_{10}$ cycloalkyl, $C_5$-$C_{10}$ cycloalkenyl, or $C_8$-$C_{10}$ cycloalkynyl group.

Additional embodiments of the disclosure are directed to methods of depositing a film comprising forming a carbon-less metal-containing film in a process cycle comprising sequential exposure of a substrate to an iodine-containing reactant, purge gas, organometallic precursor, and purge gas. The iodine-containing reactant comprises a species having a formula $RI_x$, where R is one or more of a $C_1$-$C_{10}$ alkyl, $C_3$-$C_{10}$ cycloalkyl, $C_2$-$C_{10}$ alkenyl, or $C_2$-$C_{10}$ alkynyl group, I is an iodine group and x is in a range of 1 to 4. The organometallic precursor has a structure of general formulae (I), (II), (III) or (IV)

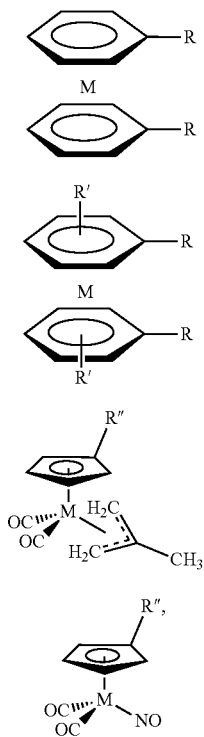

wherein M is independently selected from molybdenum (Mo), tungsten (W), osmium (Os), technetium (Tc), manganese (Mn), rhenium (Re) or ruthenium (Ru), R is independently selected from hydrogen, methyl, ethyl, isopropyl, propyl, or butyl, R' is independently selected from methyl, ethyl, isopropyl, propyl, or butyl, and R" is independently selected from a $C_3$-$C_{10}$ cycloalkyl, $C_3$-$C_{10}$ cycloalkenyl, or $C_8$-$C_{10}$ cycloalkynyl group.

Further embodiments of the disclosure are directed to an organometallic precursor having a structure of general formulae (I), (II), (III) or (IV)

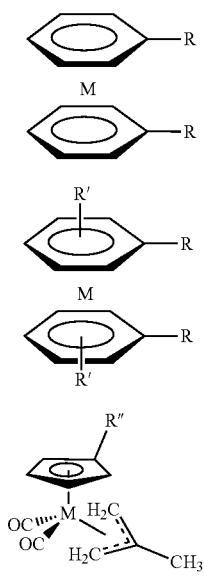

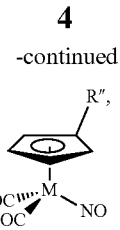

wherein M is independently selected from molybdenum (Mo), tungsten (W), osmium (Os), technetium (Tc), manganese (Mn), rhenium (Re) or ruthenium (Ru), R is independently selected from hydrogen, methyl, ethyl, isopropyl, propyl, or butyl, R' is independently selected from methyl, ethyl, isopropyl, propyl, or butyl, and R" is independently selected from a $C_3$-$C_{10}$ cycloalkyl, $C_3$-$C_{10}$ cycloalkenyl, or $C_5$-$C_{10}$ cycloalkynyl group.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Figure 1:
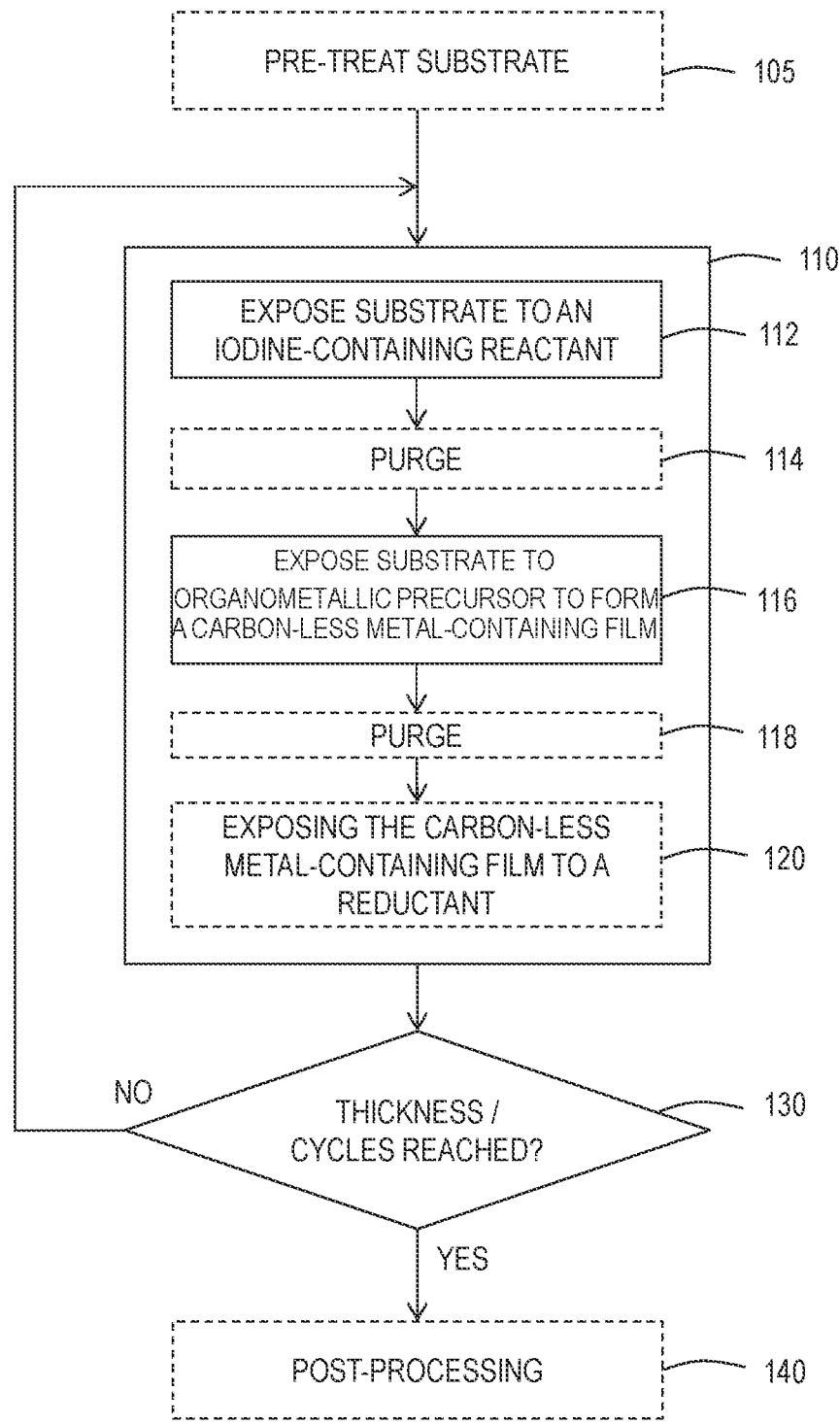
FIG. 1 illustrates a process flow diagram of a method in accordance with one or more embodiments of the disclosure.

Before describing several exemplary embodiments of the disclosure, it is to be understood that the disclosure is not limited to the details of construction or process routines set forth in the following description. The disclosure is capable of other embodiments and of being practiced or being carried out in various ways.

As used in this specification and the appended claims, the term "substrate" refers to a surface, or portion of a surface, upon which a process acts. It will also be understood by those skilled in the art that reference to a substrate can also refer to only a portion of the substrate, unless the context clearly indicates otherwise. Additionally, reference to depositing on a substrate can mean both a bare substrate and a substrate with one or more films or features deposited or formed thereon.

A "substrate", "substrate surface", or the like, as used herein, refers to any substrate or material surface formed on a substrate upon which processing is performed. For example, a substrate surface on which processing can be performed include, but are not limited to, materials such as silicon, silicon oxide, strained silicon, silicon on insulator (SOI), carbon doped silicon oxides, silicon nitride, doped silicon, germanium, gallium arsenide, glass, sapphire, and any other materials such as metals, metal nitrides, metal alloys, any metal silicides such as titanium silicide and molybdenum silicide, and other conductive materials, depending on the application. Substrates include, without limitation, semiconductor wafers. Substrates may be exposed to a pretreatment process to polish, etch, reduce, oxidize, hydroxylate (or otherwise generate or graft target chemical moieties to impart chemical functionality), anneal and/or bake the substrate surface. In addition to processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus, for example, where a film/layer or partial film/layer has been deposited onto a substrate surface, the exposed surface of the newly deposited film/layer becomes the substrate surface. What a given substrate surface comprises will depend on what materials are to be deposited, as well as the particular chemistry used.

According to one or more embodiments, the term "on", with respect to a film or a layer of a film, includes the film or layer being directly on a surface, for example, a substrate surface, as well as there being one or more underlayers between the film or layer and the surface, for example the substrate surface. Thus, in one or more embodiments, the phrase "on the substrate surface" is intended to include one or more underlayers. In other embodiments, the phrase "directly on" refers to a layer or a film that is in contact with a surface, for example, a substrate surface, with no intervening layers. Thus, the phrase "a layer directly on the substrate surface" refers to a layer in direct contact with the substrate surface with no layers in between.

According to one or more embodiments, the method uses an atomic layer deposition (ALD) process. In such embodiments, the substrate surface is exposed to the precursors (or reactive gases) sequentially or substantially sequentially. As used herein throughout the specification, "substantially sequentially" means that a majority of the duration of a precursor exposure does not overlap with the exposure to a co-reagent, although there may be some overlap.

As used in this specification and the appended claims, the terms "precursor", "reactant", "reactive gas" and the like are used interchangeably to refer to any gaseous species that can react with the substrate surface.

"Atomic layer deposition" or "cyclical deposition" as used herein refers to the sequential exposure of two or more reactive compounds to deposit a layer of material on a substrate surface. As used in this specification and the appended claims, the terms "reactive compound", "reactive gas", "reactive species", "precursor", "process gas" and the like are used interchangeably to mean a substance with a species capable of reacting with the substrate surface or material on the substrate surface in a surface reaction (e.g., chemisorption, oxidation, reduction). The substrate, or portion of the substrate, is exposed separately to the two or more reactive compounds which are introduced into a reaction zone of a processing chamber. In a time-domain ALD process, exposure to each reactive compound is separated by a time delay to allow each compound to adhere and/or react on the substrate surface and then be purged from the processing chamber. These reactive compounds are said to be exposed to the substrate sequentially. In a spatial ALD process, different portions of the substrate surface, or material on the substrate surface, are exposed simultaneously to the two or more reactive compounds so that any given point on the substrate is substantially not exposed to more than one reactive compound simultaneously. As used in this specification and the appended claims, the term "substantially" used in this respect means, as will be understood by those skilled in the art, that there is the possibility that a small portion of the substrate may be exposed to multiple reactive gases simultaneously due to diffusion, and that the simultaneous exposure is unintended.

In one aspect of a time-domain ALD process, a first reactive gas (i.e., a first precursor or compound A) is pulsed into the reaction zone followed by a first time delay. Next, a second precursor or compound B is pulsed into the reaction zone followed by a second delay. During each time delay, a purge gas, such as argon, is introduced into the processing chamber to purge the reaction zone or otherwise remove any residual reactive compound or reaction by-products from the reaction zone. Alternatively, the purge gas may flow continuously throughout the deposition process so that only the purge gas flows during the time delay between pulses of reactive compounds. The reactive compounds are alternatively pulsed until a desired film or film thickness is formed on the substrate surface. In either scenario, the ALD process of pulsing compound A, purge gas, compound B and purge gas is a cycle. A cycle can start with either compound A or compound B and continue the respective order of the cycle until achieving a film with the desired thickness. In some embodiments, there may be two reactants, A and B, that are alternatingly pulsed and purged. In other embodiments, there may be three or more reactants, A, B, and C, that are alternatingly pulsed and purged.

In an embodiment of a spatial ALD process, a first reactive gas and second reactive gas (e.g., metal precursor gas) are delivered simultaneously to the reaction zone but are separated by an inert gas curtain and/or a vacuum curtain. The substrate is moved relative to the gas delivery apparatus so that any given point on the substrate is exposed to the first reactive gas and the second reactive gas.

With reference to FIG. 1, one or more embodiments of the disclosure are directed to a method 100 of depositing a film. The method 100 illustrated in FIG. 1 is representative of an atomic layer deposition (ALD) process in which the substrate or substrate surface is exposed sequentially to the reactive gases in a manner that prevents or minimizes gas phase reactions of the reactive gases. In some embodiments, the method comprises a chemical vapor deposition (CVD) process in which the reactive gases are mixed in the processing chamber to allow gas phase reactions of the reactive gases and deposition of the film.

In some embodiments, the method 100 optionally includes a pre-treatment operation 105. The pre-treatment can be any suitable pre-treatment known to the skilled artisan. Suitable pre-treatments include, but are not limited to, pre-heating, cleaning, soaking, native oxide removal, or deposition of an adhesion layer (e.g., titanium nitride (TIN)). In one or more embodiments, an adhesion layer, such as titanium nitride, is deposited at operation 105. In other embodiments, an adhesion layer is not deposited.

In one or more embodiments, operation 105 includes a pre-treatment hydrogen anneal process. In one or more embodiments, the pre-treatment hydrogen anneal process occurs under a set of process conditions. In one or more embodiments, the set of process conditions include heat, pressure, and carrier gas. In one or more embodiments, the pre-treatment hydrogen anneal process comprises heating to a temperature in a range of from 70° C. to about 450° C., or about 100° C. to 400° C., or about 150° C. to about 350° C. In one or more embodiments, the pre-treatment hydrogen anneal process comprises a pressure in a range of from 0.5 Torr to about 20 Torr, or in the range of 1 Torr to about 15 Torr. Without intending to be bound by any particular theory of operation, the pressure in the range of from 0.5 Torr to about 20 Torr enables native oxide removal. In one or more embodiments, the pre-treatment hydrogen anneal process comprises flowing in a range of from 100 sccm to 20000 sccm of hydrogen. Without intending to be bound by any particular theory of operation, flowing in the range of from 100 sccm to 20000 sccm of hydrogen enables native oxide removal.

At deposition 110, a process is performed to deposit a metal film on the substrate (or substrate surface). The deposition process can include one or more operations to form a film on the substrate. In one or more embodiments, the process is conducted at a temperature in a range of from 150° C. to 600° C., or in the range of 200° C. to 550° C., or in the range of 250° C. to 500° C., or in the range of 300° C. to 450° C. In one or more embodiments, the process is conducted at a pressure in a range of 0.1 Torr to 20 Torr.

At operation 112, the substrate (or substrate surface) is exposed to an iodine-containing reactant. The iodine-containing reactant can be any suitable iodine-containing compound that can react with (i.e., adsorb or chemisorb onto) the substrate surface to leave an iodine-containing species on the substrate surface.

In one or more embodiments, the iodine-containing reactant comprises a species having a formula $RI_x$, where R is one or more of a $C_1$-$C_{10}$ alkyl, $C_3$-$C_{10}$ cycloalkyl, $C_2$-$C_{10}$ alkenyl, or $C_2$-$C_{10}$ alkynyl group, I is an iodine group and x is in a range of 1 to 4. The skilled artisan will recognize that "R" may be referred to as an "R group." In some embodiments, when x is in a range of 2 to 4, two or more of the iodine groups are on a same carbon atom of the R group. In some embodiments, when x is in a range of 2 to 4, one or more of the two or more iodine groups is on a different carbon atom of the R group.

In some embodiments, the iodine-containing reactant comprises one or more monoiodo alkane. Suitable monoiodo alkanes include, but are not limited to, iodomethane, iodoethane, 1-iodopropane, 2-iodopropane, 1-iodobutane, 2-iodobutane, 2-iodo-2-methylpropane, 1-iodopentane, 2-iodopentane, 3-iodopentane, 1-iodohextane, 2-iodohexane, 3-iodohexane, 1-iodoheptane, 2-iodoheptane, 3-iodoheptane, 4-iodoheptane, 1-iodooctane, 2-iodooctane, 3-iodooctane, 4-iodooctane, 1-iodononane, 2-iodononane, 3-iodononane, 4-iodononane, 5-iodononane, 1-iododecane, 2-iododecane, 3-iododecane, 4-iododecane, 5-iododecane. In some embodiments, the iodine-containing reactant comprises one or more diiodoalkane. Suitable diiodoalkanes include, but are not limited to, diiodomethane, 1,1-diiodiethane, 1,2-diiodiethane, 1,1-diiodopropane, 1,2-diiodopropane, 2,2-diiodopropane, 1,3-diiodopropane, 1,1-diiodobutane, 1,2-diiodobutane, 2,2-diiodobutane, 1,3-diiodobutane, 1,4-diiodobutane, 2,3-diiodobutane, 1,1-diiodopentane, 1,2-diiodopentane, etc. In a particular embodiment, the iodine-containing reactant comprises or consists essentially of 1-iodopropane. As used in this specification and the appended claims, the term "consists essentially of" means that the reactive species of the iodine-containing reactant are greater than or equal to 95%, 98%, 99% or 99.9% of the stated species.

In some embodiments, the iodine-containing reactant comprises any cycloalkyl, alkenyl, or alkynyl variations of the alkane-based, alkene-based or alkyne-based, respectively, iodine-containing reactants listed above. Suitable iodine-containing cycloalkanes include, but are not limited to, iodocyclopentane, iodocyclohexane, iodocycloheptane, diiodocyclohexane, and iodocyclooctane. Suitable iodine-containing alkenes include, but are not limited to, iodopentene. Suitable iodine-containing alkynes include, but are not limited to, iodopentyne.

In one or more embodiments, exposing the substrate (or substrate surface) to the iodine-containing reactant at operation 112 forms metal-iodine bonds. In one or more embodiments, exposing the substrate (or substrate surface) to the iodine-containing reactant forms Mo—I bonds, W—I bonds, Os—I bonds, Tc—I bonds, Mn—I bonds, Re—I bonds, or Ru—I bonds. In one or more embodiments, exposing the substrate (or substrate surface) to the iodine-containing reactant forms a Mo—I film, W—I film, Os—I film, Tc—I film, Mn—I film, Re—I film, or Ru—I film. In some embodiments, exposing the substrate (or substrate surface) to the iodine-containing reactant forms a molybdenum (Mo) film, tungsten (W) film, osmium (Os) film, technetium (Tc) film, manganese (Mn) film, rhenium (Re) film, or ruthenium (Ru) film that is substantially free of carbon. As used herein, the term "substantially free of carbon" means that there is less than or equal to about 5%, including less than or equal to about 4%, less than or equal to about 3%, less than or equal to about 2%, less than or equal to about 1%, and less than or equal to about 0.5% of carbon, on an atomic basis, in the molybdenum (Mo) film, tungsten (W) film, osmium (Os) film, technetium (Tc) film, manganese (Mn) film, rhenium (Re) film, or ruthenium (Ru) film. In one or more embodiments, exposing the substrate (or substrate surface) to the iodine-containing reactant forms carbon-containing compounds (i.e., alkanes) that form outside of the chamber.

At operation 114, the processing chamber is optionally purged to remove unreacted iodine-containing reactant, reaction products and by-products. As used in this manner, the term "processing chamber" also includes portions of a processing chamber adjacent the substrate surface without encompassing the complete interior volume of the processing chamber. For example, in a sector of a spatially separated processing chamber, the portion of the processing chamber adjacent the substrate surface is purged of the precursor by any suitable technique including, but not limited to, moving the substrate through a gas curtain to a portion or sector of the processing chamber that contains none or substantially none of the iodine-containing reactant. In one or more embodiments, purging the processing chamber comprises applying a vacuum. In some embodiments, purging the processing chamber comprises flowing a purge gas over the substrate. In some embodiments, the portion of the processing chamber refers to a micro-volume or small volume process station within a processing chamber. The term "adjacent" referring to the substrate surface means the physical space next to the surface of the substrate which can provide sufficient space for a surface reaction (e.g., precursor adsorption) to occur. In one or more embodiments, the purge gas is selected from one or more of nitrogen ($N_2$), helium (He), and argon (Ar). In one or more embodiments, operation 114 comprises flowing at least 200 sccm of the purge gas. In one or more embodiments, the substrate surface is purged of the iodine-containing reactant prior to exposing the substrate to an organometallic precursor.

Embodiments described herein advantageously provide depositing a metal film that has low carbon content without the use of an oxidizing agent. At operation 116, the substrate (or substrate surface) is exposed to an organometallic precursor to form a carbon-less metal-containing film on the substrate. The organometallic precursor can react with the iodine-containing species on the substrate surface to form the carbon-less metal-containing film. Without being bound by any particular theory of operation, it is believed that exposing the substrate to the iodine-containing reactant at operation 112 prior to exposure to the organometallic precursor at operation 116 prevents carbon contamination in the underlying films. In some embodiments, deposition 110 further comprises exposing the substrate to the iodine-containing reactant again before moving to decision point 130.

In some embodiments, the organometallic precursor has a structure of general formulae (I), (II), (III) or (IV)

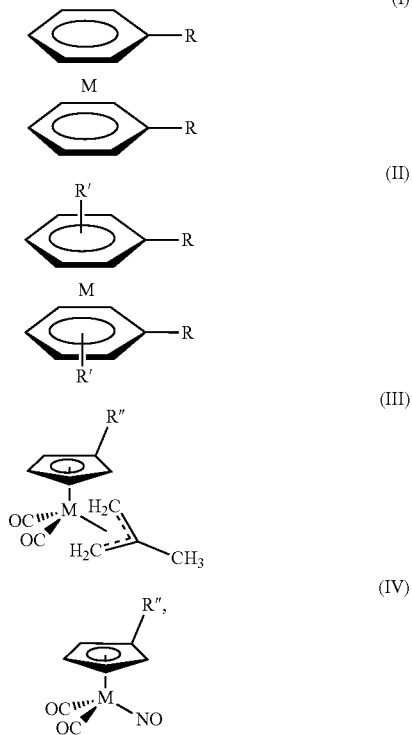

wherein M is independently selected from molybdenum (Mo), tungsten (W), osmium (Os), technetium (Tc), manganese (Mn), rhenium (Re) or ruthenium (Ru), R is independently selected from hydrogen, methyl, ethyl, isopropyl, propyl, or butyl, R' is independently selected from methyl, ethyl, isopropyl, propyl, or butyl, and R" is independently selected from a $C_5$-$C_{10}$ cycloalkyl, $C_5$-$C_{10}$ cycloalkenyl, or $C_5$-$C_{10}$ cycloalkynyl group.

In some embodiments, R=R' when the organometallic precursor has the structure of general formula (II). In some embodiments, R≠R' when the organometallic precursor has the structure of general formula (II).

In some embodiments, the organometallic precursor is etch-resistant to one or more materials. In one or more embodiments, the organometallic precursor is etch-resistant to metals, including but not limited to titanium (Ti), titanium nitride (TiN) and titanium silicide (TiSi).

At operation 118, the processing chamber is optionally purged after exposure to the organometallic precursor. Purging the processing chamber in operation 118 can be the same process or different process than the purge in operation 114. Purging the processing chamber, portion of the processing chamber, area adjacent the substrate surface, etc., removes unreacted organometallic precursor, reaction products and by-products from the area adjacent the substrate surface.

The period of time of each operation in deposition 110 can be varied in order to form a deposited film (e.g., the metal film) of a predetermined thickness. In one or more embodiments, at operation 112, the method 100 comprises exposing the substrate (or substrate surface) to an iodine-containing reactant for 1 second. In one or more embodiments, at operation 114, the method 100 optionally includes purging the processing chamber for 2 seconds. In one or more embodiments, at operation 116, the method 100 comprises exposing the substrate to the organometallic precursor for a time in the range of 0.1 second to 5 seconds. In one or more embodiments, at operation 118, the method 100 optionally includes purging the processing chamber for a time in the range of 0.1 to 10 seconds.

In some embodiments, at operation 120, the carbon-less metal-containing film is optionally exposed to a reductant. In some embodiments, the reducing agent can comprise any reductant known to one of skill in the art.

In some embodiments, the reductant comprises thermal hydrogen ($H_2$). As used in this manner, the term "thermal" means exposure to the stated material (molecular hydrogen in this example) not in a plasma. In other embodiments, the reductant comprises hydrogen ($H_2$) plasma. In one or more embodiments, the reductant comprises, or consists essentially of, an alcohol having a general formula of R—OH, wherein R is an alkyl group. In some embodiments, the alkyl group, R, has from 1 to 20 carbon atoms, or 1 to 10 carbon atoms, or 1 to 8 carbon atoms. In one or more embodiments, as an example, the general formula of R—OH includes methanol, ethanol, propanol, butanol, pentanol, hexanol, heptanol, and octanol. In one or more embodiments, the general formula of R—OH includes one or more of primary, secondary, and tertiary alcohols. In one or more embodiments, the reductant comprises or consists essentially of thermal ammonia ($NH_3$). In one or more embodiments, the reductant comprises or consists essentially of ammonia ($NH_3$) plasma.

In an un-illustrated embodiment, the method 100 further comprises exposing the metal film to plasma treatment after optionally exposing the substrate to the reductant at operation 120. In one or more embodiments, plasma treatment with inert or reactive gases is found to be effective. In one or more embodiments, the plasma treatment is generated by a remote plasma source (RPS) or a capacitively coupled plasma (CCP) or an inductively coupled plasma (ICP) with ambient like argon (Ar), helium (He), ammonia ($NH_3$), nitrogen ($N_2$), hydrogen ($H_2$), or their mixtures.

At decision 130, the thickness of the deposited film, or number of cycles of iodine-containing reactant, organometallic precursor, and/or reductant is considered. If the deposited film has reached a predetermined thickness or a predetermined number of process cycles have been performed, the method 100 moves to an optional post-processing operation 140. If the thickness of the deposited film or the number of process cycles has not reached the predetermined threshold, the method 100 returns to deposition 110 to expose the substrate surface to the iodine-containing reactant again in operation 112 and continues processing.

In one or more embodiments, the deposited film (e.g., the metal film) has a thickness in a range of from 10 Å to 500 Å, or 20 Å to 450 Å, or 30 Å to 400 Å.

The optional post-processing operation 140 can be, for example, a process to modify film properties (e.g., annealing) or a further film deposition process (e.g., additional ALD or CVD processes) to grow additional films. In some embodiments, the optional post-processing operation 140 can be a process that modifies a property of the deposited film. In some embodiments, the optional post-processing operation 140 comprises annealing the as-deposited film. In some embodiments, annealing is done at temperatures in the range of 150° C. to 600° C., or 300° C. to 550° C. The annealing environment of some embodiments comprises an inert gas (e.g., argon (Ar)) and a reducing gas (e.g., molecular hydrogen ($H_2$)). In one or more embodiments, the optional post-processing operation 140 comprises flowing in a range of from 100 sccm to 5,000 sccm of the inert gas and flowing in a range of from 100 sccm to 10,000 sccm of the reducing gas. Annealing can be performed for any suitable length of time. In some embodiments, the film is annealed for a predetermined time in the range of about 15 seconds to about 45 minutes, or in the range of about 1 minute to about 30 minutes. In some embodiments, the film is annealed for 25 minutes. In some embodiments, annealing the as-deposited film increases the density, decreases the resistivity and/or increases the purity of the film.

In the embodiment illustrated in FIG. 1, at deposition operation 110 the substrate (or substrate surface) is exposed to the iodine-containing reactant, the organometallic precursor, and the reductant sequentially. In another, un-illustrated, embodiment, the substrate (or substrate surface) is exposed to the iodine-containing reactant, the organometallic precursor, and the reductant simultaneously in a CVD reaction. In a CVD reaction, the substrate (or substrate surface) can be exposed to a gaseous mixture of the iodine-containing reactant and the organometallic precursor to deposit a carbon-less iodine-containing film. In the CVD reaction, the deposited film (e.g., the metal film) can be deposited in one exposure to the mixed reactive gas or can be multiple exposures to the mixed reactive gas with purges between.

Figure 2:
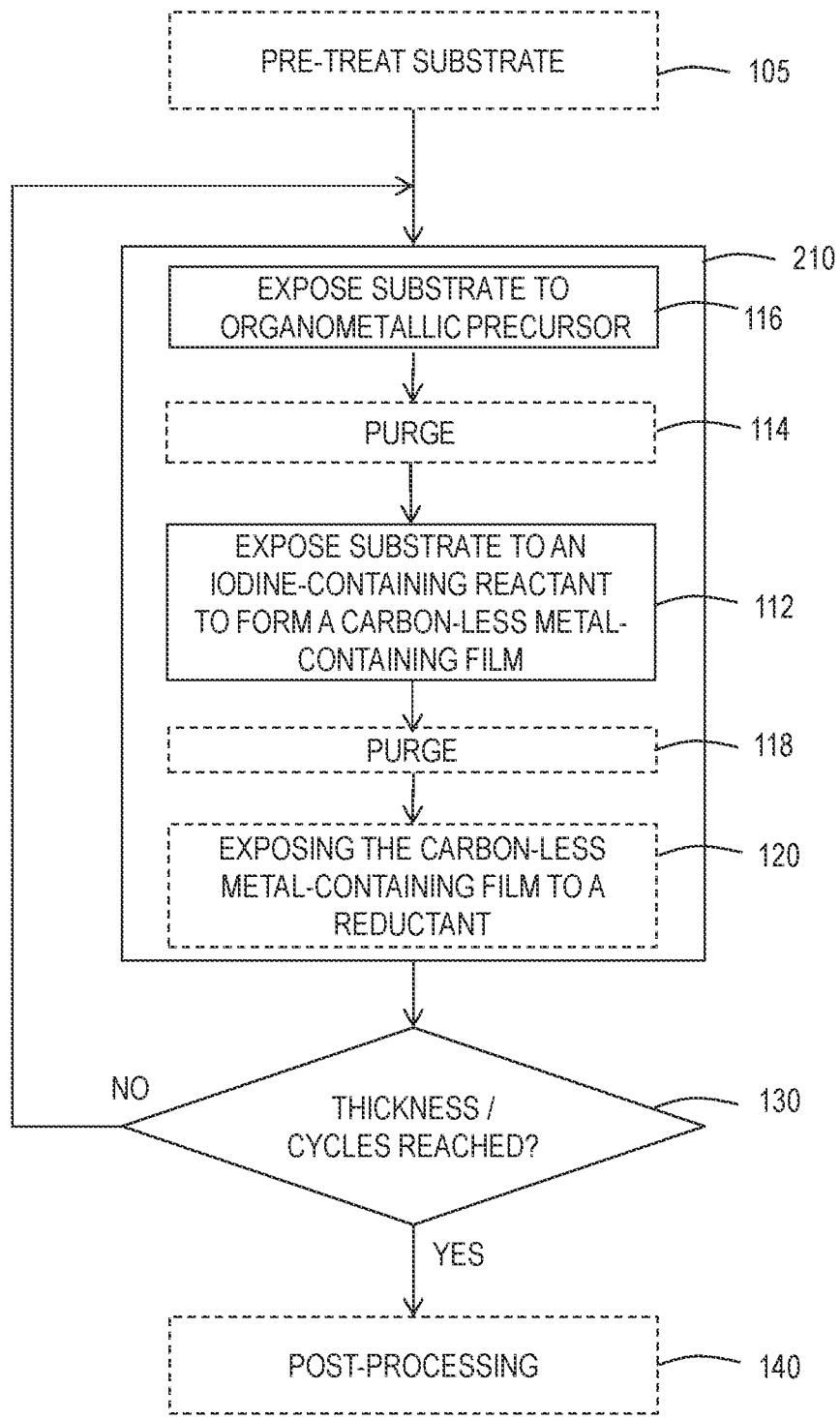
FIG. 2 illustrates a process flow diagram of a method in accordance with one or more embodiment of the disclosure.

FIG. 2 shows an alternate embodiment of a method 200. The method 200 optionally includes pre-treating the substrate at operation 105. At deposition 210, the substrate is exposed to the organometallic precursor at operation 116 prior to exposure to the iodine-containing reactant at operation 112. The embodiment illustrated in FIG. 2 shows operations 116 and 118 occurring prior to operations 112 and 114 and includes optional post-processing at operation 140. The method 200 may be described with reference to any of the operations described in this specification with respect to the method 100 of FIG. 1.

Figure 3:
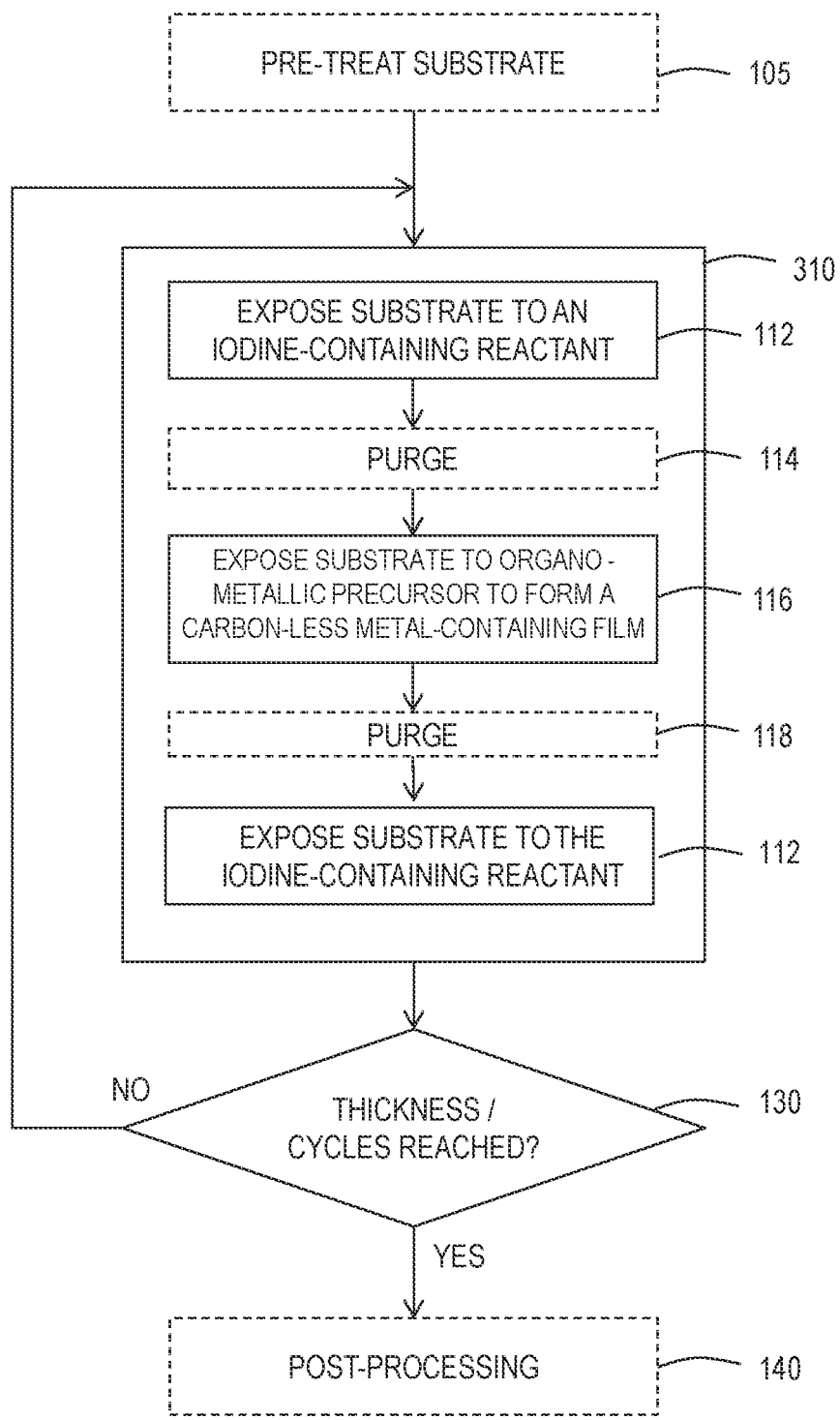
FIG. 3 illustrates a process flow diagram of a method in accordance with one or more embodiment of the disclosure.

Embodiments of the disclosure advantageously provide methods of forming metal films having low carbon content, without using an oxidizing agent or a reductant. FIG. 3 illustrates an embodiment of a method 300. The method 300 includes optionally pre-treating the substrate at operation 105. At deposition 310, the substrate is exposed to the iodine-containing reactant at operation 112 (a first exposure to the iodine-containing reactant), the processing chamber is optionally purged at operation 114, the substrate is exposed to an organometallic precursor at operation 116, the processing chamber is optionally purged at operation 118, and the substrate is exposed to the iodine-containing reactant at operation 112 (a second exposure to the iodine-containing reactant) to deposit a metal film. The embodiment illustrated in FIG. 3 includes optional post-processing at operation 140. The method 300 may be described with reference to operations 105, 112, 114, 116, 118, 130, and 140 described in this specification with respect to the method 100 of FIG. 1 or the method 200 of FIG. 2.

Without being bound by any particular theory of operation, it is believed that exposing the substrate to the iodine-containing reactant at operation 112 prior to exposure to the organometallic precursor at operation 116 prevents carbon contamination in the underlying films. In some embodiments, deposition 310 further comprises exposing the substrate to the iodine-containing reactant again (i.e., the second exposure to the iodine-containing reactant) before moving to decision point 130. In some embodiments, any operation of operations 105, 112, 114, 116, and 118 may be repeated before moving to decision point 130.

In some embodiments, the deposited film (e.g., the metal film) has a low resistivity without exposing the carbon-less metal-containing film to a reductant (optional operation 120 of FIGS. 1 and 2). In some embodiments, the period of time of each operation in deposition 310 affects the resistivity of the deposited film (e.g., the metal film). Without intending to be bound by any particular theory of operation, a longer purge time results in a metal film having a lower resistivity. For example, a purge time of 4 seconds results in a metal film having a resistivity less than or equal to 40 μΩ-cm when the metal film has a thickness of about 125 Å. In one or more embodiments, the deposited film (e.g., the metal film) has a resistivity less than or equal to 100 μΩ-cm when the metal film has a thickness of about 100 Å. In one or more embodiments, the metal film has a resistivity less than or equal to 90 μΩ-cm, less than or equal to 80 μΩ-cm, less than or equal to 70 μΩ-cm, less than or equal to 60 μΩ-cm, less than or equal to 50 μΩ-cm, less than or equal to 40 μΩ-cm, less than or equal to 30 μΩ-cm, less than or equal to 20 μΩ-cm, or less than or equal to 10 μΩ-cm when the metal film has a thickness of about 100 Å.

In some embodiments, annealing the as-deposited film at post-processing operation 140 advantageously increases the density, decreases the resistivity and/or increases the purity of the film. The inventors have surprisingly discovered that annealing the as-deposited film decreases the resistivity of the metal film to less than or equal to 30 μΩ-cm when the metal film has a thickness of about 125 Å.

In some embodiments, the deposited film (e.g., the metal film) formed by method 300 has a density greater than the density of a comparable metal film exposed to a reductant at operation 120 (FIGS. 1 and 2).

The method 300 can be performed at any suitable temperature depending on, for example, the iodine-containing reactant, the organometallic precursor, or the thermal budget of the device. In one or more embodiments, the use of high temperature processing may be undesirable for temperature-sensitive substrates, such as logic devices. In some embodiments, exposure to the iodine-containing reactant (operation 112) and the organometallic precursor (operation 116) occur at the same temperature. In some embodiments, the substrate is maintained at a temperature in a range of 150° C. to about 600° C. In some embodiments, exposure to the iodine-containing reactant (operation 112) and the organometallic precursor (operation 116) occur at different temperatures.

At decision 130, the thickness of the deposited film, or number of cycles of the first exposure to the iodine-containing reactant, organometallic precursor, and/or the second exposure to the iodine-containing reactant is considered. If the deposited film has reached a predetermined thickness or a predetermined number of process cycles have been performed, the method 300 moves to an optional post-processing operation 140. If the thickness of the deposited film or the number of process cycles has not reached the predetermined threshold, the method 300 returns to deposition 310 to expose the substrate surface to the iodine-containing reactant again in operation 112 and continues processing.

Some embodiments of the disclosure advantageously provide methods for depositing metal films with high purity. The methods of various embodiments use atomic layer deposition (ALD) to provide pure or nearly pure metal films. While some embodiments of this disclosure refer to the deposition of molybdenum, it is conceived that the principles of this disclosure enable the deposition of highly pure metal films regardless of which metal selected from the group consisting of molybdenum (Mo), tungsten (W), osmium (Os), technetium (Tc), manganese (Mn), rhenium (Re) and ruthenium (Ru) is deposited. Accordingly, these highly pure films exhibit similar properties to their associated bulk metallic materials. For example, some embodiments of this disclosure provide molybdenum films which are smoother and have lower resistance than molybdenum films deposited by conventional oxygen or hydrogen reductant processes.

In some embodiments, the metal film formed by method 300 has a carbon content less than or equal to 20%, including less than or equal to 15%, less than or equal to 10%, less than or equal to 9%, less than or equal to 8%, less than or equal to 7%, less than or equal to 6%, less than or equal to 5%, less than or equal to 4%, less than or equal to 3%, less than or equal to 2%, less than or equal to 1%, or less than or equal to 0.5% carbon, on an atomic basis. In some embodiments, the metal film formed by method 300 has a purity of greater than or equal to 90%, greater than or equal to 95%, greater than or equal to 97%, greater than or equal to 99%, greater than or equal to 99.5%, or greater than or equal to 99.9% metal atoms, including but not limited to molybdenum (Mo), tungsten (W), osmium (Os), technetium (Tc), manganese (Mn), rhenium (Re) or ruthenium (Ru), on an atomic basis.

Some embodiments of the disclosure provide methods of selectively depositing metal films on a metal surface over a dielectric surface. Some embodiments of the disclosure provide methods of selectively depositing metal films on a dielectric surface over a metal surface. As used in this specification and the appended claims, the term "selectively depositing a film on one surface over another surface", and the like, means that a first amount of the film is deposited on the first surface and a second amount of film is deposited on the second surface, where the second amount of film is less than the first amount of film, or no film is deposited on the second surface.

The term "over" used in this regard does not imply a physical orientation of one surface on top of another surface, rather a relationship of the thermodynamic or kinetic properties of the chemical reaction with one surface relative to the other surface. For example, selectively depositing a molybdenum film onto a metal surface over a dielectric surface means that the molybdenum film deposits on the metal surface and less or no molybdenum film deposits on the dielectric surface; or that the formation of a molybdenum film on the metal surface is thermodynamically or kinetically favorable relative to the formation of a molybdenum film on the dielectric surface.

The selectivity of a deposition process is generally expressed as a multiple of growth rate. For example, if one surface film is grown (or deposited on) 25 times thicker than a different surface, the process would be described as having a selectivity of 25:1. In this regard, higher ratios indicate more selective processes.

Some embodiments of this disclosure advantageously provide metal films which conformally fill gaps, in a via or trench, for example, without a seam. Some embodiments of this disclosure advantageously provide metal films (i.e., molybdenum films) that replace commonly-used cobalt (Co) as a capping layer material and replace commonly-used tungsten (W) as a conductive material for metal gap fill.

In spatial ALD embodiments, exposure to each of the process gases occurs simultaneously to different parts of the substrate so that one part of the substrate is exposed to the first reactive gas while a different part of the substrate is exposed to the second reactive gas (if only two reactive gases are used). The substrate is moved relative to the gas delivery system so that each point on the substrate is sequentially exposed to both the first and second reactive gases. In any embodiment of a time-domain ALD or spatial ALD process, the sequence may be repeated until a predetermined layer thickness is formed on the substrate surface.

Some embodiments of the disclosure are directed to processes that use a reaction chamber with multiple gas ports that can be used for introduction of different chemicals or plasma gases. Spatially, these gas ports (also referred to as channels) are separated by inert purging gases and/or vacuum pumping holes to create a gas curtain that minimizes or eliminates mixing of gases from different gas ports to avoid unwanted gas phase reactions. Wafers moving through these different spatially separated ports get sequential and multiple surface exposures to different chemical or plasma environment so that layer by layer film growth in spatial ALD mode or surface etching process occur. In some embodiments, the processing chamber has modular architectures on gas distribution components and each modular component has independent parameter control (e.g., RF or gas flow) to provide flexibility to control, for example, gas flow and/or RF exposure.

A "pulse" or "dose" as used herein is intended to refer to a quantity of a source gas that is intermittently or non-continuously introduced into the process chamber. The quantity of a particular compound within each pulse may vary over time, depending on the duration of the pulse. A particular process gas may include a single compound or a mixture/combination of two or more compounds, for example, the process gases described below.

The durations for each pulse/dose are variable and may be adjusted to accommodate, for example, the volume capacity of the processing chamber as well as the capabilities of a vacuum system coupled thereto. Additionally, the dose time of a process gas may vary according to the flow rate of the process gas, the temperature of the process gas, the type of control valve, the type of process chamber employed, as well as the ability of the components of the process gas to adsorb onto the substrate surface. Dose times may also vary based upon the type of layer being formed and the geometry of the device being formed. A dose time should be long enough to provide a volume of compound sufficient to adsorb/chemisorb onto substantially the entire surface of the substrate and form a layer of a process gas component thereon.

One or more embodiments of the disclosure are directed to methods of depositing metal films in high aspect ratio features. A high aspect ratio feature is a trench, via or pillar having a height:width ratio greater than or equal to about 10, 20, or 50, or more. In some embodiments, the metal film is deposited conformally on the high aspect ratio feature. As used in this manner, a conformal film has a thickness near the top of the feature that is in the range of about 80-120% of the thickness at the bottom of the feature.

Some embodiments of the disclosure advantageously provide for the selective deposition of metal films with high purity on metallic surfaces over dielectric surfaces. For example, selectively depositing molybdenum on copper over dielectrics advantageously provides copper capping layers without additional etch or lithography steps.

Some embodiments of the disclosure advantageously provide for the selective deposition of metal films with high purity on dielectric surfaces over metallic surfaces. For example, selectively depositing metals over dielectrics advantageously provides metal layers on barriers or other dielectrics in back end of line (BEOL) applications.

Some embodiments of the disclosure advantageously provide methods of depositing conformal metal films on substrates comprising high aspect ratio structures. In some embodiments, these conformal metal films are deposited as a metal liner film in logic devices and/or memory devices. As used in this regard, the term "conformal" means that the thickness of the metal film is uniform across the substrate surface. As used in this specification and the appended claims, the term "substantially conformal" means that the thickness of the metal film does not vary by more than about 10%, 5%, 2%, 1%, or 0.5% relative to the average thickness of the film. Stated differently a film which is substantially conformal has a conformality of greater than about 90%, 95%, 98%, 99% or 99.5%.

In some embodiments, one or more operations of the method 300 described herein are repeated. Some or all of the processes and methods of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor, transforms the general-purpose computer into a specific purpose computer (controller) that controls the chamber operation such that the processes are performed.

Embodiments of the disclosure are directed to a non-transitory computer readable medium. In one or more embodiments, the non-transitory computer readable medium includes instructions that, when executed by a controller of a processing chamber, causes the processing chamber to perform the operations of any of the methods described herein. In one or more embodiments, the processing chamber performs the operations of method 100, 200, or 300. In one or more embodiments, the processing chamber performs: optionally pre-treating the substrate (operation 105), deposition 310 which includes exposing the substrate to an iodine-containing reactant (operation 112), i.e., a first exposure to the iodine-containing reactant, optionally purging (operation 114), exposing the substrate to an organometallic precursor to form a carbon-less metal-containing film (operation 116), optionally purging (operation 118), exposing the substrate to the iodine-containing reactant (operation 112) i.e., a second exposure to the iodine-containing reactant, decision point 130, and optional post-processing operation 140.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A method of depositing a film, the method comprising:
forming a carbon-less metal-containing film in a process cycle comprising sequential exposure of a substrate to an iodine-containing reactant, purge gas, organometallic precursor, and purge gas,
wherein the iodine-containing reactant comprises a species having a formula $RI_x$, where R is one or more of a $C_1$-$C_{10}$ alkyl, $C_3$-$C_{10}$ cycloalkyl, $C_2$-$C_{10}$ alkenyl, or $C_2$-$C_{10}$ alkynyl group, I is an iodine group and x is in a range of 1 to 4, and
wherein the organometallic precursor has a structure of general formulae (III)

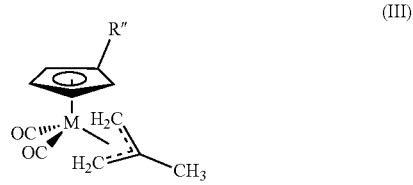

wherein M is molybdenum (Mo), and R" is independently selected from a $C_3$-$C_{10}$ cycloalkyl, $C_3$-$C_{10}$ cycloalkenyl, or $C_5$-$C_{10}$ cycloalkynyl group.

2. The method of claim 1, wherein the process cycle is conducted at a temperature in a range of from 150° C. to 600° C.

3. The method of claim 1, further comprising exposing the carbon-less metal-containing film to a reductant to form a metal film, the reductant comprising $H_2$ or hydrogen plasma.

4. The method of claim 1, wherein the substrate surface is exposed to the iodine-containing reactant prior to exposure to the organometallic precursor.

5. An organometallic precursor having a structure of general formulae (III)

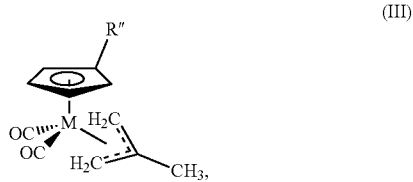

wherein M is molybdenum (Mo), and R" is independently selected from a $C_3$-$C_{10}$ cycloalkyl, $C_3$-$C_{10}$ cycloalkenyl, or $C_5$-$C_{10}$ cycloalkynyl group.

* * * * *

UNITED STATES PATENT AND TRADEMARK OFFICE
CERTIFICATE OF CORRECTION

PATENT NO.        : 12,281,387 B2
APPLICATION NO.   : 17/566026
DATED             : April 22, 2025
INVENTOR(S)       : Feng Q. Liu et al.

Page 1 of 1

It is certified that error appears in the above-identified patent and that said Letters Patent is hereby corrected as shown below:

In the Specification

•Column 4, Line 17, replace "$C_5$-$C_{10}$" before "cycloalkynyl group" with "$C_8$-$C_{10}$".

•Column 9, Line 46, replace "$C_5$-$C_{10}$" after "selected from a" and before "cycloalkyl" with "$C_3$-$C_{10}$".

•Column 9, Line 46, replace "$C_5$-$C_{10}$" after "cycloalkyl" and before "cycloalkenyl" with "$C_3$-$C_{10}$".

•Column 9, Line 47, replace "$C_5$-$C_{10}$" before "cycloalkynyl group" with "$C_8$-$C_{10}$".

•Column 11, Line 4, replace "($H_2$)" after "molecular hydrogen" and before ". In one or more" with "($H_2$))".

Signed and Sealed this
Tenth Day of June, 2025

Coke Morgan Stewart
*Acting Director of the United States Patent and Trademark Office*